US011721547B2

(12) United States Patent
Hecht et al.

(10) Patent No.: US 11,721,547 B2
(45) Date of Patent: Aug. 8, 2023

(54) METHOD FOR MANUFACTURING A SILICON CARBIDE SUBSTRATE FOR AN ELECTRICAL SILICON CARBIDE DEVICE, A SILICON CARBIDE SUBSTRATE AND AN ELECTRICAL SILICON CARBIDE DEVICE

(71) Applicant: Infineon Technologies AG, Neubiberg (DE)

(72) Inventors: Christian Hecht, Buckenhof (DE); Tobias Hoechbauer, Villach (AT); Roland Rupp, Lauf (DE); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/827,253

(22) Filed: Mar. 14, 2013

(65) Prior Publication Data

US 2014/0264374 A1    Sep. 18, 2014

(51) Int. Cl.
*H01L 21/02* (2006.01)
*H01L 21/762* (2006.01)
*H01L 29/16* (2006.01)

(52) U.S. Cl.
CPC .. *H01L 21/02529* (2013.01); *H01L 21/76254* (2013.01); *H01L 29/1608* (2013.01)

(58) Field of Classification Search
CPC ........... H01L 21/3148; H01L 21/76254; H01L 21/1608; H01L 21/02002; H01L 29/045;

(Continued)

(56) References Cited

U.S. PATENT DOCUMENTS 3,520,741 A * 7/1970 Mankarious .................. 117/108
4,912,063 A * 3/1990 Davis ................ H01L 21/02378
117/103

(Continued)

FOREIGN PATENT DOCUMENTS

| EP | 2221859 A1 | 8/2010 |
| EP | 2750198 A1 | 7/2014 |
| WO | 2013031172 A1 | 3/2013 |

OTHER PUBLICATIONS

Colinge et al., Silicon layer transfer using wafer bonding and debonding, 2001, Journal of electronic materials, vol. 30, No. 7.*

(Continued)

*Primary Examiner* — Sophia T Nguyen
(74) *Attorney, Agent, or Firm* — Murphy, Bilak, Homiller, PLLC

(57) ABSTRACT

A method for manufacturing a silicon carbide substrate for an electrical silicon carbide device includes providing a silicon carbide dispenser wafer including a silicon face and a carbon face and depositing a silicon carbide epitaxial layer on the silicon face. Further, the method includes implanting ions with a predefined energy characteristic forming an implant zone within the epitaxial layer, so that the ions are implanted with an average depth within the epitaxial layer corresponding to a designated thickness of an epitaxial layer of the silicon carbide substrate to be manufactured. Furthermore, the method comprises bonding an acceptor wafer onto the epitaxial layer so that the epitaxial layer is arranged between the dispenser wafer and the acceptor wafer. Further, the epitaxial layer is split along the implant zone so that a silicon carbide substrate represented by the acceptor wafer with an epitaxial layer with the designated thickness is obtained.

12 Claims, 7 Drawing Sheets

(58) Field of Classification Search
CPC ........... H01L 29/1608; H01L 29/66068; H01L 29/7827; H01L 21/02529; H01L 21/02378; H01L 21/0243; H01L 21/02433; H01L 21/02634; H01L 21/02447; H01L 21/02639; H01L 21/8258; H01L 29/04; H01L 29/105; H01L 29/157; H01L 29/365
USPC .... 257/77, 21.568, 21, 703, 29.003, 29.004, 257/627, 628; 438/458, 464
See application file for complete search history.

(56) References Cited

U.S. PATENT DOCUMENTS

| | | | | |
|---|---|---|---|---|
| 4,912,064 | A * | 3/1990 | Kong | C30B 25/02 117/101 |
| 5,243,204 | A * | 9/1993 | Suzuki et al. | 257/77 |
| 5,363,800 | A * | 11/1994 | Larkin et al. | 438/507 |
| 5,463,978 | A * | 11/1995 | Larkin | H01L 21/02395 438/925 |
| 5,915,180 | A * | 6/1999 | Hara | H01L 29/1608 438/270 |
| 5,915,194 | A * | 6/1999 | Powell et al. | 438/478 |
| 5,969,378 | A * | 10/1999 | Singh | H01L 29/1608 257/133 |
| 6,057,558 | A * | 5/2000 | Yamamoto | H01L 29/0847 257/77 |
| 6,228,720 | B1 * | 5/2001 | Kitabatake | H01L 21/049 438/268 |
| 6,326,279 | B1 * | 12/2001 | Kakizaki et al. | 438/406 |
| 6,403,447 | B1 * | 6/2002 | Parab | H01L 21/76251 257/E21.567 |
| 6,486,008 | B1 * | 11/2002 | Lee | H01L 21/76254 257/E21.568 |
| 6,524,935 | B1 * | 2/2003 | Canaperi | H01L 21/76254 257/E21.568 |
| 6,573,534 | B1 * | 6/2003 | Kumar | H01L 29/1608 257/77 |
| 6,821,340 | B2 * | 11/2004 | Nagasawa | C30B 25/00 117/84 |
| 7,531,428 | B2 * | 5/2009 | Dupont | H01L 21/02032 257/E21.122 |
| 7,605,055 | B2 * | 10/2009 | Celler | 438/458 |
| 7,749,863 | B1 | 7/2010 | Micovic | |
| 8,541,290 | B2 * | 9/2013 | Letertre et al. | 438/464 |
| 8,541,769 | B2 * | 9/2013 | Chu | H01L 21/02612 257/14 |
| 8,940,614 | B2 * | 1/2015 | Loboda | H01L 21/02529 117/84 |
| 2003/0153163 | A1 * | 8/2003 | Letertre et al. | 438/458 |
| 2003/0213964 | A1 * | 11/2003 | Flynn | C30B 23/00 257/85 |
| 2003/0219959 | A1 * | 11/2003 | Ghyselen | H01L 21/3148 438/458 |
| 2006/0118935 | A1 * | 6/2006 | Kamiyama | H01L 21/76254 438/455 |
| 2006/0137600 | A1 * | 6/2006 | Ellison | C30B 25/00 117/19 |
| 2006/0185582 | A1 * | 8/2006 | Atwater, Jr. | H01L 31/1892 257/E31.022 |
| 2006/0261347 | A1 * | 11/2006 | Ryu | H01L 29/66068 257/77 |
| 2007/0001175 | A1 * | 1/2007 | Kojima | C30B 25/20 257/77 |
| 2007/0190746 | A1 * | 8/2007 | Ito | H01L 21/30604 257/E21.309 |
| 2007/0277874 | A1 * | 12/2007 | Dawson-Elli | H01L 31/0687 136/256 |
| 2007/0298586 | A1 * | 12/2007 | Tanaka | H01L 21/6835 438/455 |
| 2008/0017947 | A1 * | 1/2008 | Treu | H01L 29/0603 257/476 |
| 2008/0099769 | A1 | 5/2008 | Rupp et al. | |
| 2008/0179547 | A1 * | 7/2008 | Henley | H01L 21/76254 250/492.21 |
| 2008/0217627 | A1 * | 9/2008 | Friedrichs | H01L 29/1608 257/77 |
| 2009/0014730 | A1 * | 1/2009 | Hwu | H01L 21/0485 257/77 |
| 2009/0035885 | A1 * | 2/2009 | Karlicek et al. | 438/45 |
| 2009/0075445 | A1 * | 3/2009 | Kavalieros | H01L 29/7834 438/300 |
| 2009/0101918 | A1 * | 4/2009 | Uchida | H01L 29/66068 438/105 |
| 2009/0186470 | A1 * | 7/2009 | Takahashi et al. | 438/522 |
| 2009/0218579 | A1 * | 9/2009 | Shibagaki | 257/77 |
| 2009/0221131 | A1 * | 9/2009 | Kubota | C30B 29/40 438/478 |
| 2009/0230406 | A1 * | 9/2009 | Ellison et al. | 257/77 |
| 2009/0242899 | A1 * | 10/2009 | Zhang | C30B 29/36 257/77 |
| 2010/0025695 | A1 * | 2/2010 | Shibagaki et al. | 257/77 |
| 2010/0140628 | A1 * | 6/2010 | Zhang | H01L 29/0834 257/77 |
| 2010/0147448 | A1 * | 6/2010 | Agarwal | H01L 21/76254 156/241 |
| 2010/0232200 | A1 * | 9/2010 | Shepard | G11C 13/0004 365/51 |
| 2010/0273329 | A1 * | 10/2010 | Prabhu | H01L 31/1896 438/691 |
| 2010/0301335 | A1 * | 12/2010 | Ryu | H01L 21/8213 257/49 |
| 2011/0012130 | A1 * | 1/2011 | Zhang | H01L 29/1095 257/77 |
| 2011/0057165 | A1 * | 3/2011 | Pinnington | 257/13 |
| 2011/0101413 | A1 * | 5/2011 | Song | 257/103 |
| 2011/0140172 | A1 * | 6/2011 | Chu et al. | 257/194 |
| 2011/0171812 | A1 * | 7/2011 | Letertre | H01L 21/187 438/458 |
| 2011/0204383 | A1 * | 8/2011 | Yamamoto et al. | 257/77 |
| 2011/0212598 | A1 * | 9/2011 | Ishizuka | H01L 21/76254 257/E21.568 |
| 2012/0028453 | A1 * | 2/2012 | Matsuno et al. | 438/522 |
| 2012/0083098 | A1 * | 4/2012 | Berger | H01L 21/02115 438/458 |
| 2012/0119224 | A1 * | 5/2012 | Tai | H01L 21/02002 257/77 |
| 2012/0181550 | A1 * | 7/2012 | Fujibayashi | H01L 29/1608 257/77 |
| 2012/0187419 | A1 * | 7/2012 | Elpelt | H01L 29/0843 257/77 |
| 2012/0199845 | A1 * | 8/2012 | Werkhoven | H01L 21/187 257/77 |
| 2012/0241821 | A1 * | 9/2012 | Bethoux et al. | 257/201 |
| 2012/0280270 | A1 * | 11/2012 | Ryu | H01L 29/0696 257/133 |
| 2012/0289003 | A1 * | 11/2012 | Hirler | H01L 29/42304 438/138 |
| 2012/0313112 | A1 * | 12/2012 | Wada et al. | 257/77 |
| 2013/0001703 | A1 * | 1/2013 | Sugawara | H01L 29/0661 257/378 |
| 2013/0093063 | A1 * | 4/2013 | Shur et al. | 257/622 |
| 2013/0171778 | A1 * | 7/2013 | Wada | H01L 29/7393 438/135 |
| 2013/0175539 | A1 * | 7/2013 | Choi et al. | 257/76 |
| 2013/0207188 | A1 * | 8/2013 | Ervin | H01L 21/76283 257/347 |
| 2013/0292702 | A1 * | 11/2013 | Horii | 257/77 |
| 2013/0306977 | A1 * | 11/2013 | Fujibayashi | H01L 29/1608 438/459 |
| 2014/0014972 | A1 * | 1/2014 | Nakano et al. | 257/77 |
| 2014/0030836 | A1 * | 1/2014 | Murali | H01L 29/66462 438/46 |
| 2014/0061670 | A1 * | 3/2014 | Wada | H01L 29/872 257/77 |
| 2014/0203371 | A1 * | 7/2014 | Alptekin | H01L 29/66477 257/368 |

(56) References Cited

U.S. PATENT DOCUMENTS

| | | | | |
|---|---|---|---|---|
| 2014/0217422 A1* | 8/2014 | Mine | H01L 29/1608 | 257/77 |
| 2014/0252373 A1 | 9/2014 | Mauder et al. | | |
| 2014/0252376 A1* | 9/2014 | Itoh | H01L 29/1608 | 257/77 |
| 2014/0284615 A1* | 9/2014 | Mauder | H01L 21/3085 | 257/77 |
| 2014/0367782 A1* | 12/2014 | Cheng | H01L 27/0255 | 257/350 |
| 2015/0214040 A1* | 7/2015 | Celler | H01L 21/7813 | 438/458 |
| 2015/0235909 A1* | 8/2015 | Cheng | H01L 21/28008 | 438/155 |
| 2015/0311328 A1* | 10/2015 | Takei | H01L 29/7397 | 257/77 |
| 2016/0190301 A1* | 6/2016 | Aichinger | H01L 29/0696 | 257/77 |
| 2019/0103271 A1* | 4/2019 | Tawara | H01L 21/02576 | |

OTHER PUBLICATIONS

Layer transfer by ion implantation and wafer bonding.*
R. Stein, B. Thomas, and C. Hecht: "Epitaxial Growth of $H-SiC on (0001) C-face Substrates by Cold-Wall and Hot-Wall Chemical Vapor Deposition." Materials Science Forum vol. 556-557 (2007), p. 89-92. 4 Pages.
H. Kono, T. Suzuki, M. Mizukami, C. Ota, S. Harada, J. Senzaki, K. Fukuda, and T. Shinohe: "1360 V, 5.0 mcm Double-Implanted MOSFETs Fabricated on 4H-SiC (000-1)." Materials Science Forum vol. 645-648 (2010), p. 987-990. 4 Pages.
M. Bruel, B. Aspar, B. Charlet, C. Maleville, T. Poumeyrol, A. Soubie, A.J. Auberton-Herve, J.M. Lamure, T. Barge, F. Metral, and S. Trucchi: "Smart Cut: A Promisig New SOI Material Technology." Proc. IEEE Tucson, Arizona (Piscataway, NJ, USA, 1995) (1995), p. 178-179. 3 Pages.
M. Bruel: Nucl. "Application of Hydrogen Ion Beams to Silicon on Insulator Material Technology." Instr. Meth. B 108 (1996), p. 313-319. 7 Pages.
T. Höchbauer, A. Misra, M. Nastasi, and J.W. Mayer: "Physical Mechanisms Behind the Ion-cut in Hydrogen Implanted Silicon." Journal of Applied Physics vol. 92 No. 5 (2002), p. 2335-2342. 8 Pages.
L.Di Cioccio, Y. Le Tiec, F. Letertre, C. Jaussaud, and M. Bruel: "Silicon Carbide on Insulator Formation Using the Smart Cut Process." Electronics Letters vol. 32 No. 12 (1996), p. 1144-1145. 2 Pages.
Takahashi, Jun, et al., "Influence of the Seed Face Polarity on the Sublimation Growth of α-SiC", Japanese Journal of Applied Physics, vol. 34, Sep. 1995, 4694-4698.

* cited by examiner

METHOD FOR MANUFACTURING A SILICON CARBIDE SUBSTRATE FOR AN ELECTRICAL SILICON CARBIDE DEVICE, A SILICON CARBIDE SUBSTRATE AND AN ELECTRICAL SILICON CARBIDE DEVICE

FIELD

Embodiments relate to silicon carbide devices and silicon carbide manufacturing processes and in particular to a method for manufacturing a silicon carbide substrate for an electrical silicon carbide device, a silicon carbide substrate and an electrical silicon carbide device.

BACKGROUND

The crystal structure of silicon carbide materials can be explained by a sequence of silicon-carbon (Si—C) double layers in the direction of the crystallographic c-axis. Consequently, each SiC-substrate wafer sawed perpendicular to the c-axis comprises a silicon face (0001) and a carbon face (000-1). The active layer required for devices (the drift layer) is usually deposited epitaxially on a silicon carbide substrate wafer. In this connection, thickness and doping can be specifically adjusted to later device properties. Silicon carbide devices (e.g. switches or diodes) are mainly manufactured on the silicon face, since the doping control (e.g. the nitrogen doping during epitaxy) at this site may be better controllable due to the so-called site-competition. A nitrogen incorporation coefficient and in this way the doping level can be adjusted in a large range during the SiC-deposition by the silicon/carbon ratio in the gas phase. A background doping of less than $1*10^{15}$ cm$^{-3}$ can be reached in this way without large effort in standard SiC epitaxy equipment, if the deposition is done on the silicon face. However, an epitaxy on the carbon face of the silicon carbide shows an approximately ten times higher nitrogen incorporation with no or only a low dependency on the carbon/silicon ratio, so that a targeted attainment of a doping level below $1*10^{16}$ cm$^{-3}$ is only possible with large efforts (e.g. very low process pressure and/or high process temperature) or is even not possible.

However, devices, which are manufactured on the C-face, allow (e.g. for the lateral SiC-MOSFET, silicon carbide metal oxide semiconductor field effect transistor) achieving higher channel mobility compared to silicon face SiC-MOSFET.

SUMMARY

A method for manufacturing a silicon carbide substrate for an electrical silicon carbide device according to an embodiment comprises providing a silicon carbide dispenser wafer comprising a silicon face and a carbon face. Further, the method comprises depositing a silicon carbide epitaxial layer on the silicon face of the dispenser wafer and implanting ions with a predefined energy characteristic forming an implant zone within the epitaxial layer, so that the ions are implanted with an average depth within the epitaxial layer corresponding to a designated thickness of an epitaxial layer of the silicon carbide substrate to be manufactured. Additionally, the method comprises bonding an acceptor wafer onto the epitaxial layer so that the epitaxial layer is arranged between the dispenser wafer and the acceptor wafer. Further, the method comprises splitting the epitaxial layer along the implant zone so that a silicon carbide substrate represented by the acceptor wafer with an epitaxial layer with the designated thickness is obtained.

Embodiments may be based on the finding that a silicon carbide substrate with an epitaxial layer with a carbon face can be made available for the manufacturing of an electrical silicon carbide device by applying a high energy ion cutting method to an epitaxial layer grown on the silicon face of a silicon carbide wafer and by bonding with the silicon face of the epitaxial layer to another wafer. In this way, a silicon carbide substrate with an exposed carbon face of an epitaxial layer can be obtained, although the epitaxial layer was deposited on a silicon face of a silicon carbide wafer. Such a silicon carbide substrate may allow to manufacture electric silicon carbide devices on the carbon face of an epitaxial layer so that the channel mobility of such a device (e.g. SiC-MOSFET, silicon carbide metal oxide semiconductor field effect transistor) can be significantly increased. Further, a silicon carbide substrate providing a carbon face of an epitaxial layer with low doping density (e.g. less than $1*10^{16}$ cm$^{-3}$) can be provided for the manufacturing of a device. Based on such silicon carbide substrates electrical silicon carbide devices with a blocking voltage above 500 V can be realized, for example.

In some embodiments, the splitting of the epitaxial layer is done by heating the epitaxial layer to a temperature between 600° C. and 1300° C. At such temperatures the epitaxial layer may automatically split along the implant zone due to hydrogen gas bubbles growing together.

Some embodiments further comprise implanting ions in the remaining epitaxial layer on the dispenser with another or the same predefined energy characteristic forming another implant zone within the epitaxial layer, so that the ions are implanted with an average depth within the remaining epitaxial layer corresponding to another or the same designated thickness of an epitaxial layer of a further silicon carbide substrate to be manufactured. Additionally, the method may comprise bonding another acceptor wafer onto the remaining epitaxial layer, so that the remaining epitaxial layer is arranged between the dispenser wafer and the further acceptor wafer, and splitting the remaining epitaxial layer along the implant zone so that a further silicon carbide substrate represented by the further acceptor wafer with an epitaxial layer with the other or the same designated thicknesses is obtained. In this way, a thick epitaxial layer can be deposited at the beginning. This thick epitaxial layer can be used to manufacture two or more silicon carbide substrates. Therefore, only one deposition of an epitaxial layer may be sufficient to produce several silicon carbide substrates. Additionally, an intermediate surface conditioning step (e.g. CMP) may be performed between two transfer steps.

In some embodiments, the silicon carbide epitaxial layer may be deposited so that the epitaxial layer comprises a dopant density of less than $1*10^{16}$ cm$^{-3}$. Based on such a silicon carbide substrate, devices with high channel mobility and high blocking voltages can be realized.

Further embodiments relate to a method for manufacturing an electrical silicon carbide device comprising providing or manufacturing a silicon carbide substrate manufactured according to the concept described above and manufacturing the electrical silicon carbide device on the carbon face of the epitaxial layer of the silicon carbide substrate. In this way, electrical silicon carbide devices with high channel mobility can be obtained.

Other embodiments relate to a silicon carbide substrate comprising a carrier wafer being a tungsten wafer, a poly crystalline silicon carbide wafer, or a graphite wafer coated with silicon carbide. Further, the silicon carbide substrate comprises a silicon carbide epitaxial layer attached to the carrier wafer and comprising a carbon face opposing the carrier wafer, so that an electrical silicon carbide device is manufacturable on the carbon face of the epitaxial layer.

Further embodiments relate to electrical silicon carbide devices comprising a carrier wafer, a silicon carbide epitaxial layer, and an electrical silicon carbide device structure. The silicon carbide epitaxial layer is attached to the carrier wafer and comprises a carbon face facing the carrier wafer and a silicon face opposing the carrier wafer. Further, the electrical silicon carbide device structure is manufactured on the carbon face of the epitaxial layer. Such an electrical silicon carbide device may comprise a high channel mobility.

BRIEF DESCRIPTION OF THE DRAWINGS

Some embodiments of apparatuses and/or methods will be described in the following by way of example only, and with reference to the accompanying figures, in which.

DETAILED DESCRIPTION

Figure 1:
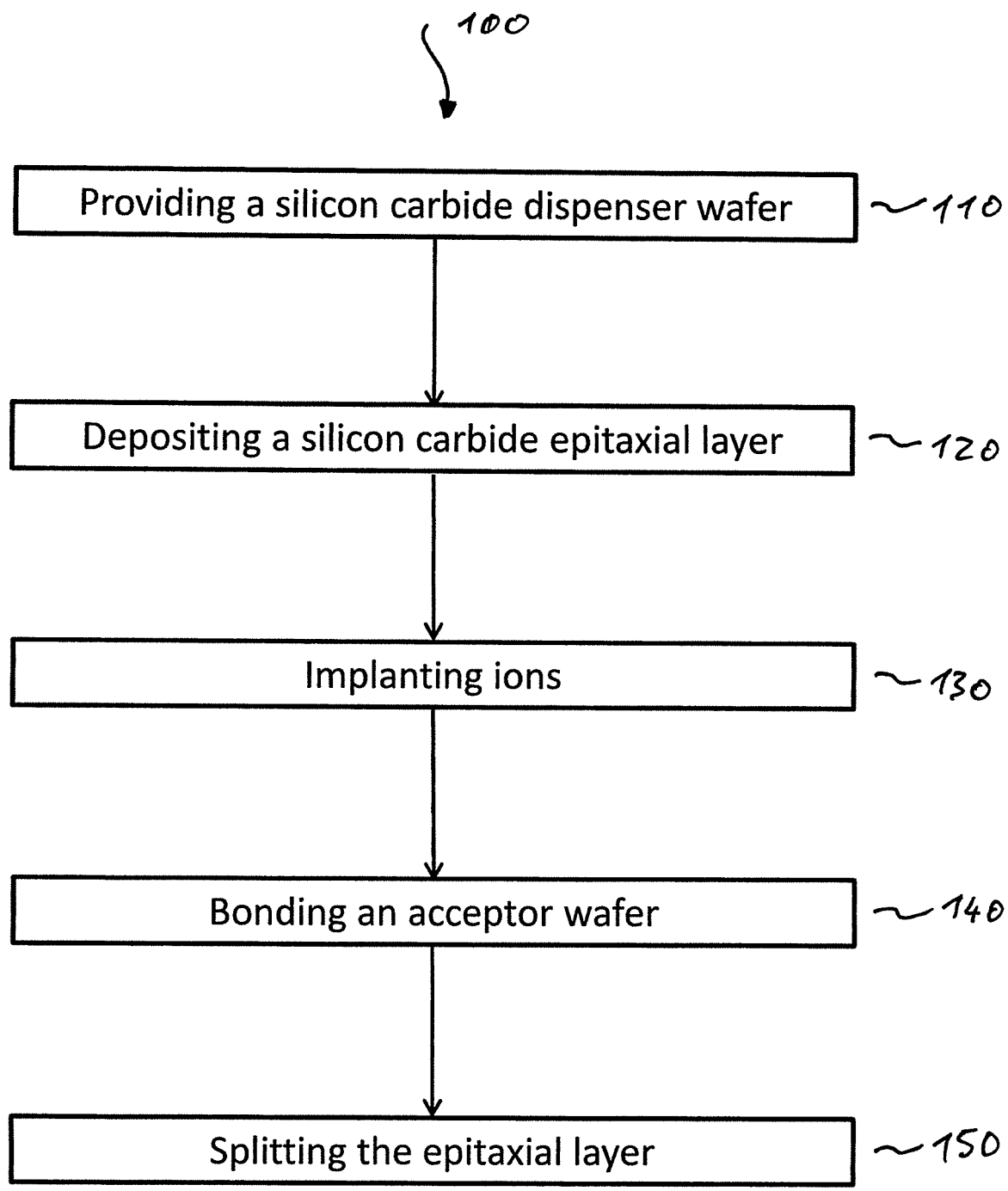
FIG. 1 shows a flowchart of a method for manufacturing a silicon carbide substrate.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

Silicon carbide (SiC) occurs in many different crystal structures, also called polytypes. Despite the fact that ideal silicon carbide polytypes chemically comprise 50% carbon atoms with 50% silicon atoms, each silicon carbide polytype comprises other electrical properties. While there is a large variety of polytypes, the most common polytypes for electronics are the cubic 3C—SiC, the hexagonal 4H—SiC and 6H—SiC, as well as the rhombohedral 15R—SiC, for example. The polytypes can be characterized by the stacking sequence of the reciprocal layers of the silicon carbide structure.

For cubic crystals, three Miller indices, hkl, are used to describe the directions and planes in the crystal. These are integers with the same ratio as the reciprocals of the intercepts with X-, Y-, and Z-axes, respectively. For hexagonal structures four principle axes can be used (a1, a2, a3 and c). However, only three may be necessary to unambiguously identify a plane or a direction. The three a-vectors with 120° angles between each other, may be all in the close-packed plane called c-plane whereas the c-axis is perpendicular to this plane.

In this way the crystal structure of silicon carbide crystals can be explained by a sequence of silicon-carbon double layers in the direction of the crystallographic c-axis. Consequently, each silicon carbide wafer sawed perpendicular to the c-axis comprises a silicon face with Miller indices 0001, which means that the last layer is basically a layer of silicon atoms (a large majority of silicon atoms builds up the surface at this side of the wafer) and a carbon face with Miller indices 000-1, which means that basically a layer of carbon atoms builds up the surface (e.g. a large majority of carbon atoms builds up the surface of this side of the wafer).

However, silicon carbide wafers are often sawed with a slight tilt to a crystal plane, which is perpendicular to the c-axis. In this way, the doping control may be significantly better at the silicon face. For example, a tilt between the surface of the wafer and a crystal plane perpendicular to the c-axis of the silicon carbide crystal of less than 10° (e.g. between 2° and 8°) may exist. However, also such slightly tilted sawed wafers comprise a silicon face and a carbon face since at one side the silicon atoms constitute the large majority (e.g. more than 70%, more than 80%, more than 90% or more than 97% of the atoms at the surface) of atoms building up the surface at this side and at the opposite side the carbon atoms constitute the large majority (e.g. more than 70%, more than 80%, more than 90% or more than 97% of the atoms at the surface) of the atoms building up the surface of the wafer at this side.

In other words, a carbon face (C-face, carbon site) of a silicon carbide wafer can be a surface of the silicon carbide wafer which corresponds to a 000-1 plane of a silicon carbide crystal with a slight tilt of less than 10° (or less than 8°, 5° or 2°) to a crystal plane which is perpendicular to the c-axis of the silicon carbide crystal. Consequently, a silicon face (Si face, silicon site) may be a surface of the silicon carbide wafer which corresponds to a 0001 plane of a silicon carbide crystal with a slight tilt of less than 10° (or 8°, 5° or 2°) to a plane which is perpendicular to the c-axis of the silicon carbide crystal. However, also a silicon carbide wafer without tilt (planes of the wafer are perpendicular to the c-axis) can be used.

FIG. 1 shows a flowchart of a method for manufacturing a silicon carbide substrate for an electrical silicon carbide device according to an embodiment. The method 100 comprises providing 110 a silicon carbide dispenser wafer comprising a silicon face and a carbon face and depositing 120 a silicon carbide epitaxial layer on the silicon face of the dispenser wafer. Further, the method 100 comprises implanting 130 ions with a predefined energy characteristic forming an implant zone within the epitaxial layer, so that the ions are implanted with an average depth within the epitaxial layer corresponding to a designated thickness of an epitaxial layer of the silicon carbide substrate to be manufactured. Additionally, the method 100 comprises bonding 140 an acceptor wafer onto the epitaxial layer so that the epitaxial layer is arranged between the dispenser wafer and the acceptor wafer. Further, the method 100 comprises splitting 150 the epitaxial layer along the implant zone so that a silicon carbide substrate represented by the acceptor wafer carrying an epitaxial layer with the designated thickness is obtained so that the Carbon face is exposed as a new surface (e.g. directly or after a surface treatment process, e.g. CMP, chemical mechanical polishing).

In this way, a silicon carbide substrate comprising an epitaxial layer with a carbon face for manufacturing an electrical silicon carbide device (e.g. a switch, a diode or a MOSFET) can be provided. This can allow the manufacturing of silicon carbide devices with significantly higher channel mobility which significantly can reduce the on-resistance of such devices. Further, a silicon carbide substrate with the carbon face available and with doping levels of an epitaxial layer deposited on a silicon face can be provided. In this way, significantly lower doping levels or doping densities can be reached (e.g. less than $1*10^{16}$ cm$^{-3}$ or less than $1*10^{15}$ cm$^{-3}$ can be reached. Therefore, electrical silicon carbide devices with high blocking voltages (e.g. 600 V to 1700 V) can be realized on such silicon carbide substrates. Additionally, the defect density can be significantly reduced, since some epitaxy defects occur with higher concentration at the silicon face whereas they do not occur or occur less at the carbon face (e.g. step bunching, i.e. the forming of steps at the surface of the epitaxial layer).

The dispenser wafer is a silicon carbide wafer and can provide a seed surface for the deposition 120 of the silicon carbide epitaxial layer, for example. It is called dispenser wafer since it dispenses at least partly the deposited silicon carbide epitaxial layer to the acceptor wafer during the manufacturing of the silicon carbide substrate. Similarly, the acceptor wafer is referred to as an acceptor wafer since it is bonded 140 onto the epitaxial layer and accepts at least partly the epitaxial layer after splitting 150 the epitaxial layer along the implant zone.

The silicon carbide dispenser wafer comprises a silicon face and a carbon face as mentioned above. The silicon carbide epitaxial layer is deposited on the silicon face of the dispenser wafer so that the doping concentration can be varied in a large range. Consequently, the deposition of the silicon carbide epitaxial layer ends with a silicon face.

Ionized hydrogen atoms or ionized hydrogen molecules may be used as ion implantation species. Besides hydrogen ions, one or more other ionized noble gases, such as Helium for example, can constitute the ion implantation species. Furthermore, as ion implantation species a combination of hydrogen ions and an ionized noble gas species can be chosen. In the later case of a co-implantation, the different ion implantation species may be implanted individually, e.g. the hydrogen ion implantation first, followed by the noble gas ion implantation. Also, a low dose pre-implantation of a precursor such as boron may be added to the implantation sequence.

Further, the ions are implanted with a predefined energy characteristic. The energy of an ion depends on the speed and/or mass of the ion, when the ion collides with the surface of the epitaxial layer and determines in this way the average depth at which the ion will stop. The predefined energy characteristic may determine an average energy and/or an energy distribution of the ions to be implanted. The average depth of the ions within the epitaxial layer may result from the average energy of the ions and defines in this way the average depth of the implant zone. Further, the energy dispersion or variation of the ions around the average energy may determine or establish the vertical expansion of the implant zone, e.g. thickness of the implant zone. A low energy variation may lead to a small implant zone and vice-versa. In the case of an ion implantation sequence with different ion implantation species, the energy characteristic may be different for each ion implantation species. Implantation doses may range between $1\times10^{15}$ and $1.5\times10^{17}$ cm$^{-2}$.

The energy characteristic may be predefined so that the implant zone has a distance to the surface of the epitaxial layer corresponding to a designated thickness of the epitaxial layer of the silicon carbide substrate to be manufactured. The designated thickness may be varied in a broad range and can be chosen according to requirements of an electrical silicon carbide device to be manufactured on the silicon carbide substrate later on, for example.

For example, the predefined energy characteristic may be optionally selected, so that the designated thickness of the epitaxial layer of the silicon carbide substrate to be manufactured is equal to or larger than a designated drift layer of an electrical silicon carbide device.

The epitaxial layer is split 150 along the implant zone. This may be done in various ways. For example, the epitaxial layer is heated to a temperature between 600° C. and 1300° C. (or between 700° C. and 1200° C. or between 900° C. and 1000° C.), so that the epitaxial layer breaks apart due to hydrogen gas bubbles growing together within the implant zone. If other ions than hydrogen are implanted, hydrogen atoms can be additionally in-diffused after the implantation step to reinforce the splitting process.

Alternatively, external forces may be applied to the dispenser wafer and the acceptor wafer so that the epitaxial layer breaks apart along the implant zone, since the crystal bonds in the implant zone may be weakened by the implanted ions.

The splitting of the epitaxial layer along the implant zone results in two separated wafers. The first separated wafer comprises the silicon carbide dispenser wafer and the remaining epitaxial layer, while the second separated wafer comprises the acceptor wafer and the epitaxial layer with the designated thickness. The acceptor wafer with the attached epitaxial layer with the designated thickness represents the silicon carbide substrate to be manufactured.

In other words, the epitaxial layer may be split so that the epitaxial layer of the silicon carbide substrate with the designated thickness comprises a carbon face accessible for a manufacturing of an electrical silicon carbide device, for example.

Figure 2A:
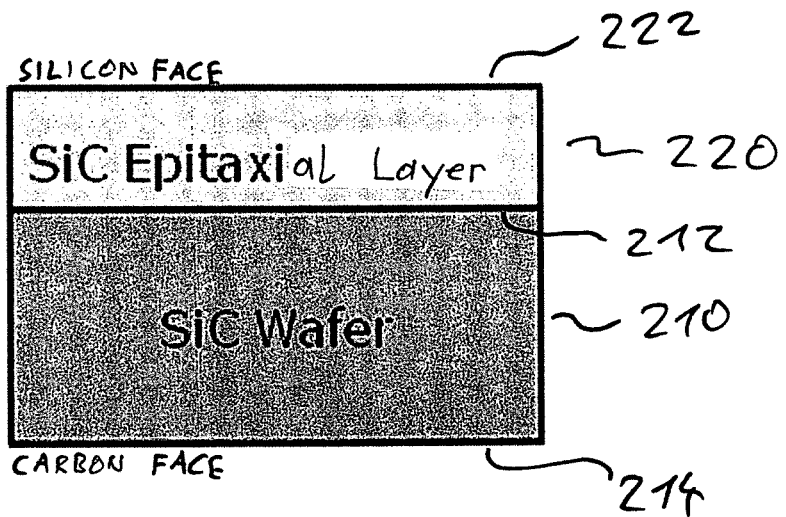
FIG. 2A shows a schematic illustration of a silicon carbide epitaxial layer deposited on a silicon carbide dispenser wafer.
Figure 2B:
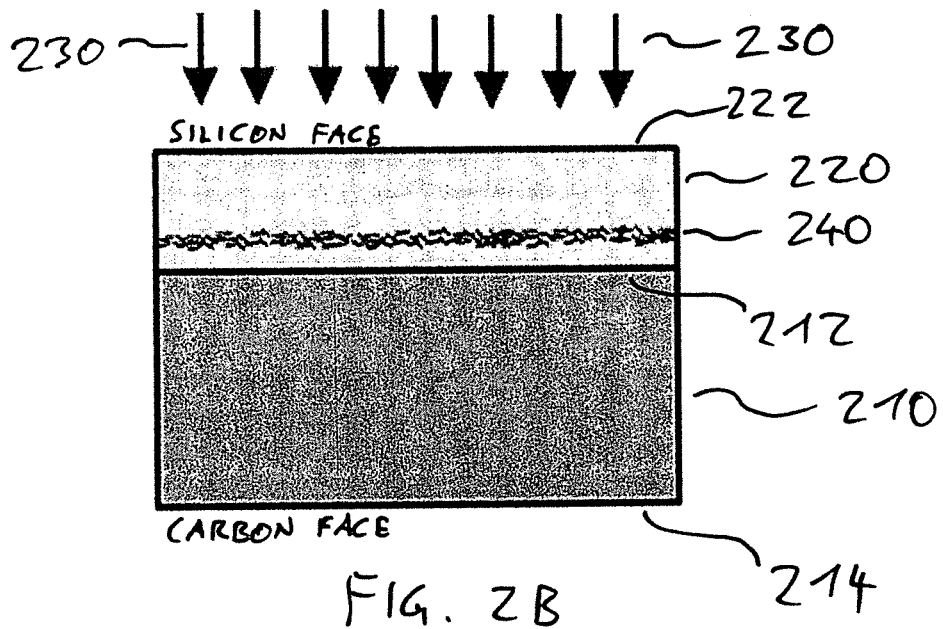
FIG. 2B shows a schematic illustration of an implant of ions.
Figure 2C:
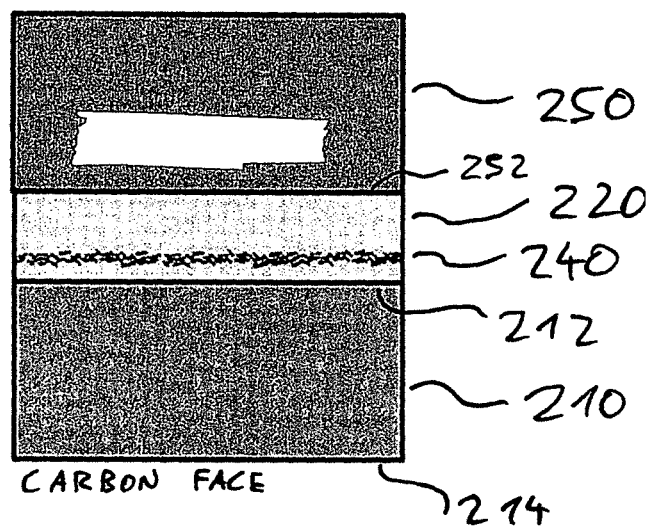
FIG. 2C shows a schematic illustration of an acceptor wafer bonded onto the epitaxial layer.
Figure 2D:
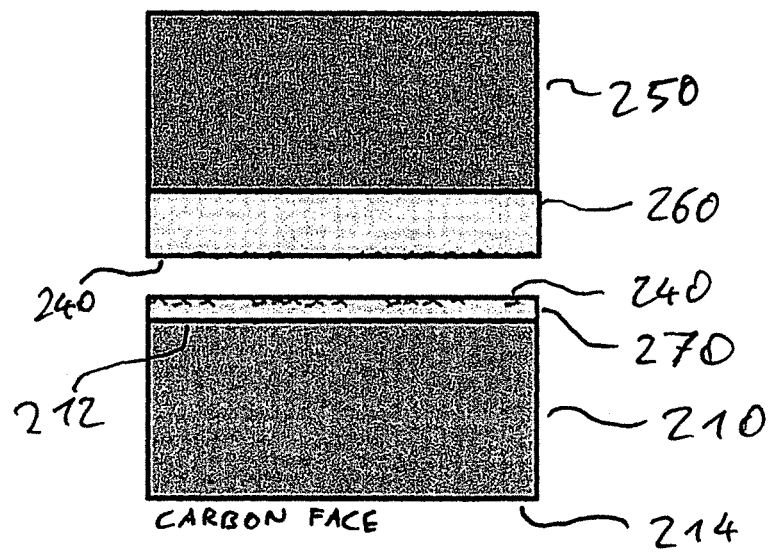
FIG. 2D shows a schematic illustration of a split epitaxial layer.
Figure 2E:
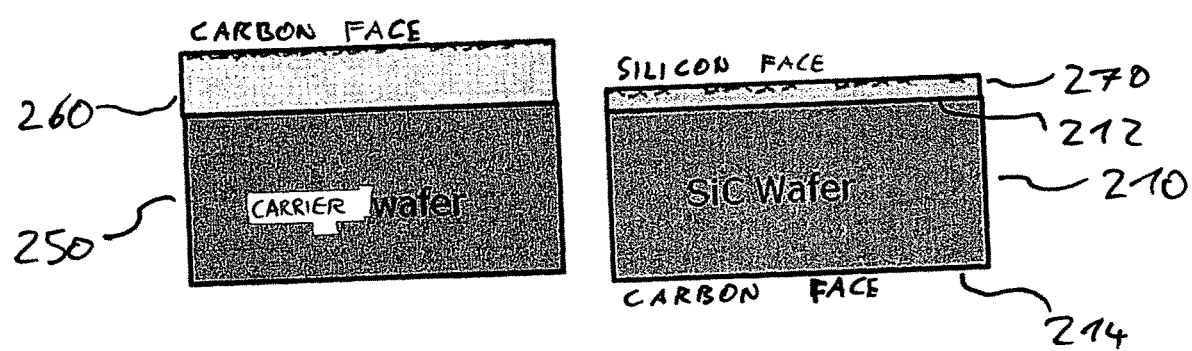
FIG. 2E shows a schematic illustration of a silicon carbide dispenser wafer with remaining epitaxial layer and a manufactured silicon carbide substrate.

FIGS. 2A to 2E show a schematic illustration of the manufacturing of a silicon carbide substrate. FIG. 2A shows a silicon carbide dispenser wafer 210 comprising a silicon face 212 and a carbon face 214. Further, a deposited silicon carbide epitaxial layer 220 on the silicon face 212 of the dispenser wafer 210 is shown. Since the epitaxial layer is deposited on the silicon face of the silicon carbide dispenser wafer, the silicon carbide epitaxial layer ends with a silicon face 222 as well. Further, FIG. 2B shows the implant of ions 230 forming an implant zone 240 within the epitaxial layer 220. FIG. 2C illustrates an acceptor wafer 250 bonded onto the epitaxial layer 220. The acceptor wafer 250 may also be called carrier wafer. The acceptor wafer 250 is bonded to the epitaxial layer 220 along a bonding border plane 252. Afterwards, the epitaxial layer 220 is split along the implant zone 240 which is shown in FIG. 2D. The epitaxial layer 260 with the designated thickness may constitute a drift layer of a silicon carbide device manufactured onto this epitaxial layer later on. The epitaxial layer 260 exposes a carbon face and the remaining epitaxial layer 270 exposes a silicon face. Finally, FIG. 2E shows the separated acceptor wafer (or carrier wafer) 250 with the epitaxial layer 260 with a designated thickness and the dispenser wafer 210 with the remaining epitaxial layer 270.

The acceptor wafer may comprise or consist of any material with a thermal expansion coefficient close to SiC (e.g. within a range of +/−30%, 20%, 10% or 5% of the thermal expansion coefficient of SiC), which is bondable or attachable to a silicon carbide epitaxial layer. For example, the acceptor wafer may be a tungsten wafer, a poly crystalline silicon carbide wafer or a graphite wafer coated with silicon carbide. A tungsten wafer may comprise more than 50% (or more than 70% or more than 90%) of tungsten or consist of tungsten (neglecting impurities), a poly crystalline silicon carbide wafer may comprise more than 50% (or more than 70% or more than 90%) of poly crystalline silicon carbide or consist of poly crystalline silicon carbide (neglecting impurities) and a graphite wafer may comprise more than 50% (or more than 70% or more than 90%) of graphite or consist of graphite (neglecting impurities). Since the acceptor wafer is not necessarily a wafer with properties for deposition of an epitaxial layer (as it is the dispenser wafer), the material of the acceptor wafer can be selected so that the material costs can be reduced or a material with desired or required properties for an electrical silicon carbide device to be manufactured onto the silicon carbide substrate can be selected.

In other words, FIG. 2A shows a silicon face epitaxy, FIG. 2B shows a high energy proton implantation, FIG. 2C shows a wafer bonding, FIG. 2D shows an anneal and drift layer transfer and FIG. 2E shows a further processing and a possible reclaim of the silicon carbide dispenser wafer, for example. FIGS. 2A to 2E show an epitaxy layer with C-face surface for a silicon carbide device by a high energy implantation and ion cut, for example.

The silicon carbide substrate to be manufactured is obtained by splitting the epitaxial layer along the implant zone, so that the silicon carbide dispenser wafer may be still available with the remaining epitaxial layer. Therefore, optionally or additionally, one or more silicon carbide substrates may be manufactured by utilizing the remaining epitaxial layer on the dispenser wafer without a deposition of further epitactic silicon carbide. A surface conditioning step (e.g. CMP) might be done to ensure a surface quality necessary for the further processing steps. For example, further ions may be implanted in the remaining epitaxial layer on the dispenser wafer with another or the same predefined energy characteristic forming another implant zone within the epitaxial layer so that the ions are implanted with an average depth within the remaining epitaxial layer corresponding to another or the same designated thickness of an epitaxial layer of a further silicon carbide substrate to be manufactured. Furthermore, another acceptor wafer can be bonded onto the remaining epitaxial layer so that the remaining epitaxial layer is arranged between the dispenser wafer and the further acceptor wafer. The remaining epitaxial layer can be split along the implant zone so that a further silicon carbide substrate represented by the further acceptor wafer with an epitaxial layer with the other or the same designated thickness is obtained. In this way, the dispenser wafer with the deposited epitaxial layer can be used several times to manufacture several silicon carbide substrates, while only one time-consuming and costly deposition of the epitaxial layer (with a thickness of several times the designated thickness of the epitaxial layer of the silicon carbide substrates to be manufactured) may be necessary.

Alternatively, optionally at least the dispenser wafer can be reused. A surface conditioning step (e.g. CMP) might be done to ensure a surface quality necessary for the further processing steps. For example, further silicon carbide may be deposited epitaxially on the remaining epitaxial layer (or onto the silicon carbide dispenser wafer) to increase the thickness of the remaining epitaxial layer. Further, ions may be implanted with another or the same predefined energy characteristic forming an implant zone within either the remaining epitaxial layer or the deposited further silicon carbide epitaxial layer, so that the ions are implanted with an average depth within the remaining silicon carbide epitaxial layer or the deposited further silicon carbide epitaxial layer with increased thickness corresponding to another or the same designated thickness of a further silicon carbide substrate to be manufactured. Furthermore, another acceptor wafer may be bonded onto the deposited further epitaxial layer so that the deposited further epitaxial layer is arranged between the dispenser wafer and the further acceptor wafer. The remaining epitaxial layer or the deposited further silicon carbide layer may be split along the implant zone so that a further silicon carbide substrate represented by the further acceptor wafer with an epitaxial layer with the other or the same designated thickness is obtained. In this way, the expensive dispenser wafer can be reused several times. If further silicon carbide with suitable thickness is deposited onto the silicon carbide dispenser wafer, this dispenser wafer can be used for a nearly unlimited number of wafers, for example.

Due to the deposition of the epitaxial layer on the silicon face of the dispenser wafer, the dopant density or dopant level can be varied in a large range. For example, the silicon carbide epitaxial layer may be deposited so that the epitaxial layer comprises a dopant density of less than $1*10^{16}$ cm$^{-3}$ or less than $1*10^{15}$ cm$^{-3}$ or the epitaxial layer may comprise a dopant density between $1*10^{16}$ cm$^{-3}$ and $4*10^{15}$ cm$^{-3}$. Therefore, a large variety of electrical silicon carbide devices may be realizable on such silicon carbide substrates. For example, electrical silicon carbide devices with high channel mobility of electrons and a high blocking voltage (e.g. 600 V to 1700 V) can be realized.

Optionally, or additionally, further implants can be realized at the silicon face of the epitaxial layer before the acceptor wafer is bonded onto the epitaxial layer to produce a designated dopant distribution of the later backside of a silicon carbide device manufactured on the silicon carbide substrate. In other words, optionally, additionally or alternatively, a designated dopant distribution may be implanted within the epitaxial layer corresponding to a required dopant distribution at a silicon face of the epitaxial layer for an electrical silicon carbide device to be realized on the carbon face of the epitaxial layer of the silicon carbide substrate to be manufactured. In this way, an additional implant during a later manufacturing of an electrical silicon carbide device can be avoided. In particular, in silicon carbide devices it is possible that the designated dopant distribution, which can represent e.g. an emitter layer or/and a field stop layer, does not change significantly during the subsequent high-temperature steps due to the small diffusion coefficients of doping atoms in silicon carbide.

Optionally or additionally, the method for manufacturing may further comprise one or more steps of surface treatment (e.g. polishing or cleaning).

Some embodiments relate to a method for manufacturing a silicon carbide substrate for an electrical silicon carbide device comprising providing a silicon carbide dispenser wafer comprising a silicon face and a carbon face. The silicon face is formed by a surface of an epitaxial layer of the silicon carbide dispenser wafer. Further, the method comprises using a high energy ion cutting method to split the epitaxial layer along an implant zone so that a silicon carbide substrate represented by an acceptor wafer bonded to the epitaxial layer of the silicon carbide dispenser wafer and an epitaxial layer with a designated thickness is obtained.

Further, the method may comprise one or more additional, optional features realizing one or more aspects of the concept described above.

Figure 3:
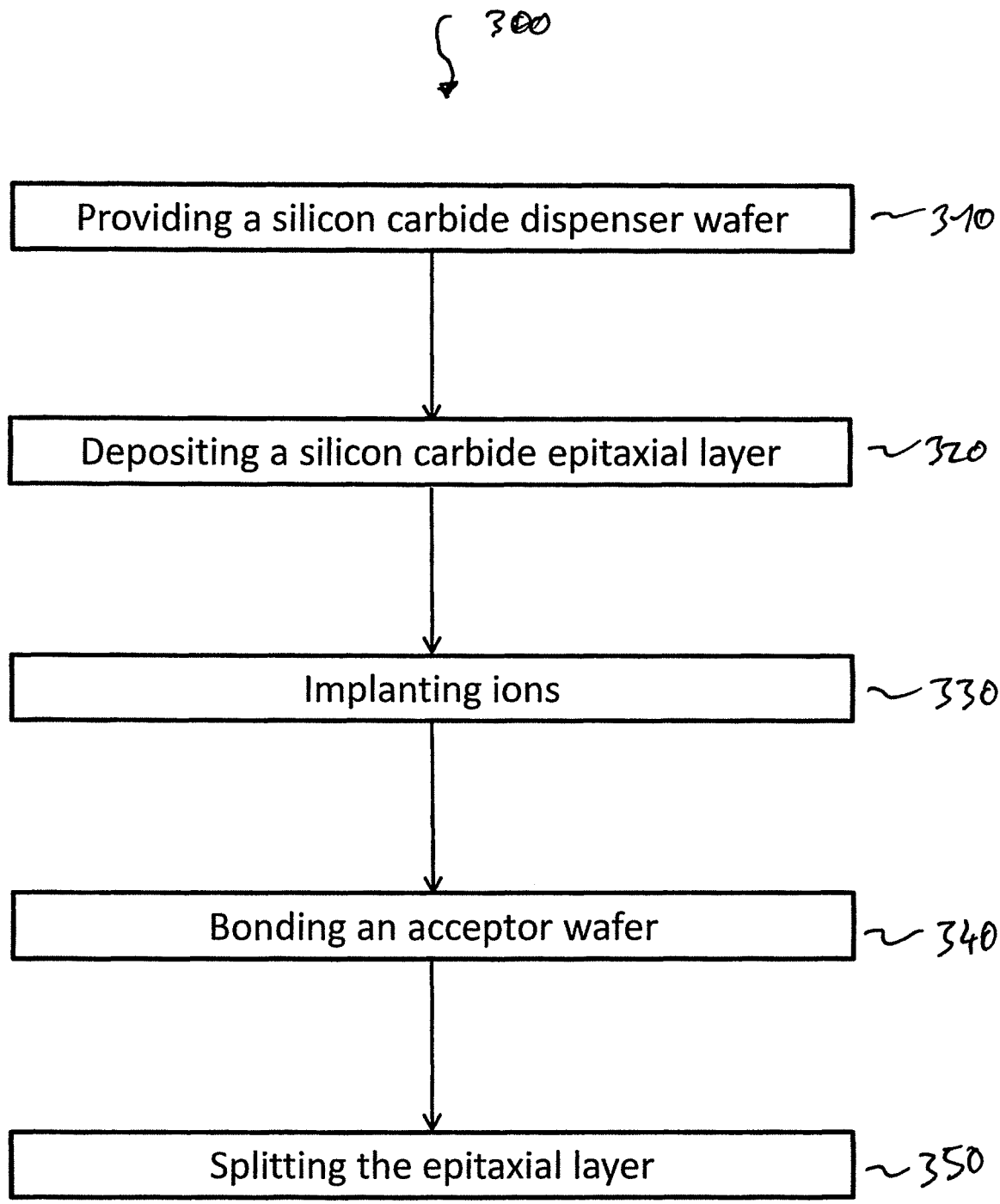
FIG. 3 shows a flowchart of a method for manufacturing a silicon carbide substrate.

FIG. 3 shows a flowchart of a method for manufacturing a silicon carbide substrate for an electrical silicon carbide device according to an embodiment. The method 300 comprises providing 310 a silicon carbide dispenser wafer comprising a silicon face and a carbon face and depositing 320 a silicon carbide epitaxial layer on the silicon face of the dispenser wafer so that the epitaxial layer comprises a dopant density of less than $1*10^{16}$ cm$^{-3}$. Further, the method 300 comprises implanting 330 ions with a predefined energy characteristic forming an implant zone within the epitaxial layer so that the ions are implanted with an average depth within the epitaxial layer corresponding to a designated thickness of an epitaxial layer of the silicon carbide substrate to be manufactured. Furthermore, the method 300 comprises bonding 340 an acceptor wafer onto the epitaxial layer so that the epitaxial layer is arranged between the dispenser wafer and the acceptor wafer. The epitaxial layer is split 350 along the implant zone by heating the epitaxial layer to a temperature between 600° C. and 1300° C. (or between 700° C. and 1200° C.), so that a silicon carbide substrate represented by the acceptor wafer carrying an epitaxial layer with the designated thickness is obtained.

Further, the method 300 may comprise one or more additional, optional features realizing one or more aspects of the concept described above (e.g. in connection with FIGS. 1 and 2).

Figure 4:
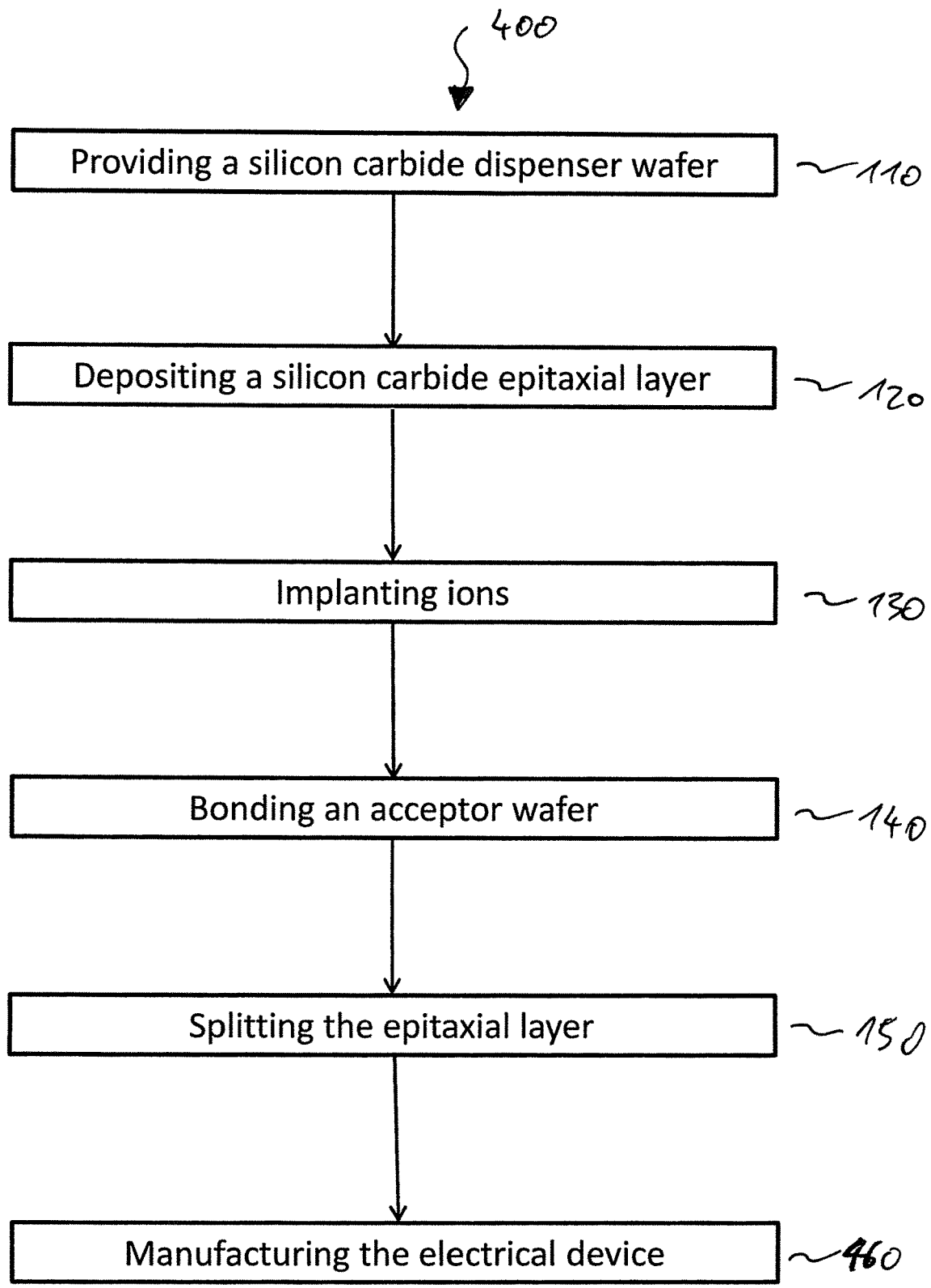
FIG. 4 shows a flowchart of a method for manufacturing an electrical silicon carbide device.

Based on a silicon carbide substrate manufactured according to the described concept or one of the described embodiments, one or more electrical silicon carbide devices can be manufactured on the carbon face of the epitaxial layer of the silicon carbide substrate. FIG. 4 shows a flowchart of a method for manufacturing an electrical silicon carbide device according to an embodiment. The method 400 comprises manufacturing 110, 120, 130, 140, 150 a silicon carbide substrate according to the concept or according to one of the embodiments described above. Alternatively, such a silicon carbide substrate is provided. Further, the method 400 comprises manufacturing 460 the electrical silicon carbide device on the carbon face of the epitaxial layer of the silicon carbide substrate.

In this way, an electrical silicon carbide device with high channel mobility can be realized. Further, an electrical silicon carbide device with high blocking voltage may be enabled.

The manufactured electrical silicon carbide device may be a switch, a diode, a transistor, a MOSFET or an electrical circuit comprising several electrical elements, for example.

The manufacturing of the electrical silicon carbide device may comprise among others implanting active regions, producing oxides (e.g. gate oxide, inter metal oxide) and/or depositing gates, contacts, metal lines or vias, for example. A back side metallization or similar processes or structures at the back side of the electrical silicon carbide device may be realized later on.

Further, the method 400 may comprise one or more additional, optional features realizing one or more aspects of the concept or of one of the embodiments (e.g. FIGS. 1 to 3) described above.

For example, the manufactured electrical silicon carbide device may comprise a blocking voltage above 500 V (or above 600 V, above 1000 V, above 1500 V, above 1700 V or above 2000 V or between 600 V and 1700 V). In other words, the epitaxial layer may be deposited so that an epitaxial layer with a predefined dopant density is obtained resulting in the possibility of manufacturing an electrical silicon carbide device with high blocking voltage.

Some electrical silicon carbide devices may require a backside metallization for contacting the device. Depending on the material of the acceptor wafer, the backside of the acceptor wafer can be used for such a contact. For this purpose, a conductive bond layer may be arranged between acceptor wafer and epitaxial layer (e.g. by reactive metal-silicide bonding). However, the acceptor wafer can also be removed from the epitaxial layer to get access to the backside (silicon face) of the epitaxial layer. In other words, the method 400 may further comprise attaching the silicon carbide substrate with the manufactured electrical silicon carbide device to a carrier wafer facing the electrical silicon carbide device and removing the acceptor wafer from the epitaxial layer comprising the electrical silicon carbide device attached to the carrier wafer. The acceptor wafer may be reused for further silicon carbide substrates. The access to the silicon face of the epitaxial layer may be sufficient to realize the required backside contact.

The carrier wafer may be attached to an insulator (e.g. silicon dioxide) or a passivation (e.g. silicon nitride) on top of one or more metal layers realizing the wiring of the silicon carbide device, so that the acceptor wafer may be electrically isolated from the electrical silicon carbide device. Alternatively or optionally, the carrier wafer may establish a connection to one or more contact areas (e.g. pads) of the electrical silicon carbide device.

Optionally or additionally, a metal layer can be realized at the back side of the epitaxial layer. In other words, the method 400 may further comprise producing a backside metal layer on the backside of the epitaxial layer comprising the electrical silicon carbide device. In this way, a metal contact can be realized at the side of the epitaxial layer opposing (arranged at the far side) the manufactured electrical silicon carbide device.

Optionally or additionally, the back side of the electrical silicon carbide device may be attached to an electrically conductive wafer after the production of the back side metal contact or layer and the carrier wafer may be removed. In this way, a reliable back side contact can be realized and the front side is available for connecting one or more input and/or output structures (e.g. pads) of the electrical silicon carbide device.

Figure 5:
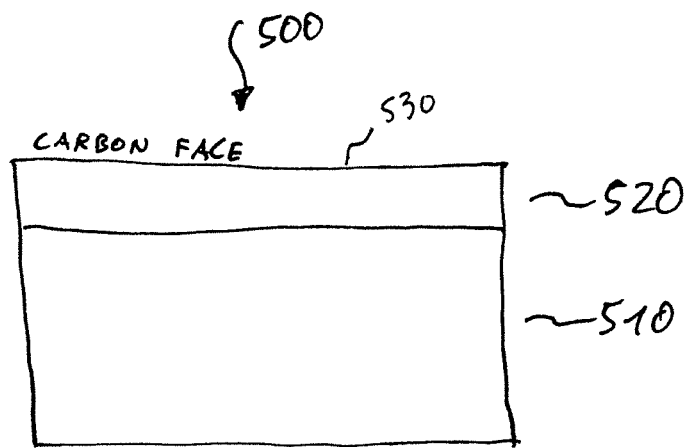
FIG. 5 shows a schematic illustration of a silicon carbide substrate.

FIG. 5 shows a schematic illustration of a silicon carbide substrate 500 according to an embodiment. The silicon carbide substrate 500 comprises a carrier wafer 510 being a tungsten wafer, a poly crystalline silicon carbide wafer or a graphite wafer coated with silicon carbide. Further, the silicon carbide substrate 500 comprises a silicon carbide epitaxial layer 520 attached to the carrier wafer 510 and comprising a carbon face 530 opposing (arranged at the far side) the carrier wafer so that an electrical silicon carbide device is manufacturable or can be manufactured on the carbon face 530 of the epitaxial layer 520.

The silicon carbide substrate 500 may comprise additional, optional features corresponding to one or more aspects of the concept or one or more embodiments described above.

Figure 6:
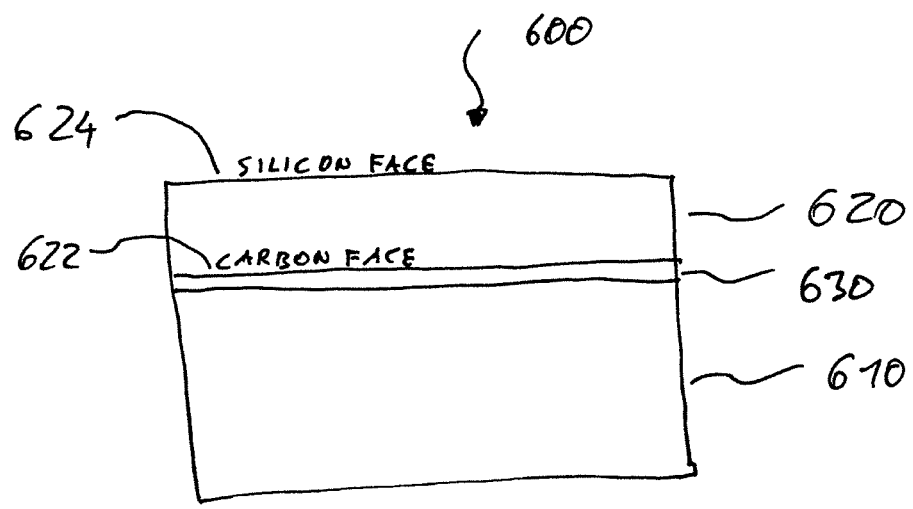
FIG. 6 shows a schematic illustration of an electrical silicon carbide device.

Further, FIG. 6 shows a schematic illustration of an electrical silicon carbide device 600 according to an embodiment. The electrical silicon carbide device 600 comprises a carrier wafer 610, a silicon carbide epitaxial layer 620, and an electrical silicon carbide device structure 630. The silicon carbide epitaxial layer 620 is attached to the carrier wafer 610 and comprises a carbon face 622 facing the carrier wafers 610 and a silicon face 624 opposing (arranged at the far side) the carrier wafer 610. The electrical silicon carbide device structure 630 is manufactured on the carbon face 622 of the epitaxial layer 620.

In this way, the backside of the epitaxial layer 620 is accessible for a backside contact, for example.

The electrical silicon carbide device 600 may comprise additional, optional features corresponding to one or more aspects of the described concept or one of the embodiments described above.

Some embodiments relate to a carbon side SiC device for an upside down transfer of an epitaxial layer by an ion cut method with high energy ion implant. For the manufacturing of suitable lateral C-face SiC-MOSFETs with a voltage range of 600V to 1700V, a silicon face epitaxy with dopings in the region of $1*10^{16}$ cm$^{-3}$ and $4*10^{15}$ cm$^{-3}$ may be required. For higher blocking voltages even lower dopings may be required. Such carbon face epitaxial layers can be manufactured by the described concept.

Compared to SiC devices produced on a silicon face, the manufacturing of such devices at the carbon face leads to a significantly better channel mobility and therefore also to a better forward current behavior and less on resistance for lateral SiC-MOSFET, for example. Additionally, several surface epitaxy defects arise at the carbon face with lower concentration compared to the silicon face or do even not appear (e.g. step bunching, i.e. the formation of steps at the surface of the epitaxial layer).

The proposed concept uses an ion cut technology in connection with high energy ion implants and an upside down transfer of the SiC epitaxial layer manufactured at the silicon face before. In this connection, an epitaxial layer with desired doping and with a thickness which is (slightly) larger than the thickness required for the device, added at the silicon face of a silicon carbide wafer. Afterwards, a high energy proton implementation takes place, at which the ion energy and the resulting depth of penetration of the implantation species in the silicon carbide epitaxial layer is (exactly or basically) adjusted to the thickness of the desired drift layer. Afterwards the epitaxially processed and ion implanted wafer is transferred by wafer bonding (e.g. reactive and/or conductive by a metal silicide reaction zone) to an acceptor wafer. This acceptor wafer comprises or consists of a material which is compatible to a SiC-technology (e.g. tungsten, poly crystalline silicon carbide, graphite wafer coated by silicon carbide). After bonding at moderate bond temperatures (e.g. lower than 700° C.), the carrier wafer (acceptor wafer)-silicon carbide wafer sandwich may be heated to a temperature between 700° C. and 1200° C. In the meantime, a formation and a growing together of highly compressed hydrogen gas bubbles within the ion implant zone occurs which finally causes a breakage of the whole epitaxial layer along the ion implant zone. In this way, a transfer of the silicon carbide epitaxial layer to the carrier wafer (acceptor wafer) is done, whereby an effective turnover of the drift layer (upside down) can be achieved. Therefore, the desired carbon face lies at the surface during the following processing without requiring further epitaxial process, for example. During the further course of the processing, the front side of the device (including doping implantation, metallization and processing edge passivation) can be completed. Afterwards, the acceptor wafer can be removed (e.g. mechanically, chemically, by laser lift-off, by a reclaim of the acceptor wafer). An attachment of a carrier wafer to the front side may be possible for mechanical stabilization since the resulting thickness of the removed device structure may be too thin for an independent handling. Next steps may be applying and annealing of a backside metal.

Alternatively, the acceptor wafer may be kept for the further processing. For example, this may be of interest if the acceptor wafer is conductively connected to the transferred layer and may comprise a good thermal conductivity.

The dispenser wafer, on which the epitaxial layer was produced, may be available for further processes without material loss, leading to a high potential for cost reductions.

An aspect of the described concept is the supply of a SiC based substrate with a thickness and doping adjusted to a drift layer of devices to be manufactured. This substrate may comprise a 000-1-orientation of the surface (carbon face) to be processed. The substrate may be manufactured by a high energy ion cut method following an epitaxial process at the silicon face.

The expensive SiC substrate can be reused again and again since its original thickness may basically keep the same, so that the costs can be significantly reduced.

For example, it is also possible to produce the epitaxial layer on the silicon face with a thickness which corresponds to several times the desired or designated drift layer thickness. In this way, the epitaxial layer can be subject to an ion cut process several times and several drift layers can be transferred to different acceptor wafers. Thus, a significant reduction of costs can be realized for the cost intensive epitaxy process (long heating and cooling times can be avoided).

Further, optionally, a processing of the silicon face can be done before the transfer of the epitaxial layer to the acceptor wafer with the aim to configure the later device backside specifically (e.g. with an allover or selective ion implantation for better contacting or also for implementing emitter structures).

Embodiments may further provide a computer program having a program code for performing one of the above methods, when the computer program is executed on a computer or processor. A person of skill in the art would readily recognize that steps of various above-described methods may be performed by programmed computers. Herein, some embodiments are also intended to cover program storage devices, e.g., digital data storage media, which are ma-chine or computer readable and encode machine-executable or computer-executable programs of instructions, wherein said instructions perform some or all of the steps of said above-described methods. The program storage devices may be, e.g., digital memories, magnetic storage media such as magnetic disks and magnetic tapes, hard drives, or optically readable digital data storage media. The embodiments are also intended to cover computers programmed to perform said steps of the above-described methods or (field) programmable logic arrays ((F)PLAs) or (field) programmable gate arrays ((F)PGAs), programmed to perform said steps of the above-described methods.

The description and drawings merely illustrate the principles of the invention. It will thus be appreciated that those skilled in the art will be able to devise various arrangements that, although not explicitly described or shown herein, embody the principles of the invention and are included within its spirit and scope. Furthermore, all examples recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

Functional blocks denoted as "means for . . . " (performing a certain function) shall be understood as functional blocks comprising circuitry that is adapted for performing a certain function, respectively. Hence, a "means for s.th." may as well be understood as a "means being adapted or suited for s.th.". A means being adapted for performing a certain function does, hence, not imply that such means necessarily is performing said function (at a given time instant).

Functions of various elements shown in the figures, including any functional blocks labeled as "means", "means for providing a sensor signal", "means for generating a transmit signal", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Further, it is to be understood that the disclosure of multiple steps or functions disclosed in the specification or claims may not be construed as to be within the specific order. Therefore, the disclosure of multiple steps or functions will not limit these to a particular order unless such steps or functions are not interchangeable for technical reasons. Furthermore, in some embodiments a single step may include or may be broken into multiple sub steps. Such sub steps may be included and part of the disclosure of this single step unless explicitly excluded.

What is claimed is:

1. A method for manufacturing a silicon carbide device, the method comprising:

providing a silicon carbide dispenser wafer comprising a silicon face and a carbon face;

depositing a silicon carbide epitaxial layer on the silicon face of the dispenser wafer, the silicon carbide epitaxial layer comprising a silicon face facing away from the dispenser wafer;

implanting a designated dopant distribution into the silicon face of the silicon carbide epitaxial layer, wherein the designated dopant distribution is implanted before an acceptor wafer is bonded onto the silicon carbide epitaxial layer;

implanting ions with a predefined energy characteristic to form an implant zone within the silicon carbide epitaxial layer, wherein the ions are implanted with an average depth within the silicon carbide epitaxial layer corresponding to a designated thickness of an epitaxial layer of the silicon carbide substrate being manufactured;

bonding the acceptor wafer onto the silicon face of the implanted silicon carbide epitaxial layer, so that the silicon carbide epitaxial layer is arranged between the dispenser wafer and the acceptor wafer; and splitting the silicon carbide epitaxial layer along the implant zone, so that a silicon carbide substrate represented by the acceptor wafer with the epitaxial layer having the designated thickness is obtained;

wherein the silicon carbide epitaxial layer is split, so that the epitaxial layer of the silicon carbide substrate with the designated thickness has a carbon face opposite the silicon face onto which the acceptor wafer is bonded, wherein the designated dopant distribution is disposed at a face of the silicon carbide epitaxial layer with the designated thickness opposite to the carbon face accessible for silicon carbide device fabrication, wherein the method further comprises manufacturing the electrical silicon carbide device on the carbon face of the epitaxial layer of the silicon carbide substrate, and wherein the depositing of the silicon carbide epitaxial layer is the only epitaxial deposition step performed between providing the silicon carbide dispenser wafer and manufacturing the electrical silicon carbide device.

2. The method according to claim 1, wherein the splitting of the silicon carbide epitaxial layer comprises heating the silicon carbide epitaxial layer to a temperature between 600° C. and 1300° C.

3. The method according to claim 1, wherein the acceptor wafer is a tungsten wafer, a poly crystalline silicon carbide wafer, or a graphite wafer coated with silicon carbide.

4. The method according to claim 1, further comprising:
after splitting the silicon carbide epitaxial layer along the implant zone, implanting ions in a remaining silicon carbide epitaxial layer on the dispenser wafer with another or the same predefined energy characteristic forming another implant zone within the remaining silicon carbide epitaxial layer, so that the ions are implanted with an average depth within the remaining silicon carbide epitaxial layer corresponding to another or the same designated thickness of an epitaxial layer of a further silicon carbide substrate being manufactured;
bonding another acceptor wafer onto the remaining silicon carbide epitaxial layer, so that the remaining silicon carbide epitaxial layer is arranged between the dispenser wafer and the further acceptor wafer; and
splitting the remaining silicon carbide epitaxial layer along the another implant zone, so that a further silicon carbide substrate represented by the further acceptor wafer with an epitaxial layer having the other or the same designated thickness is obtained.

5. The method according to claim 1, further comprising:
after splitting the silicon carbide epitaxial layer along the implant zone, depositing further silicon carbide by epitaxy on a remaining silicon carbide epitaxial layer on the dispenser wafer;
implanting ions with another or the same predefined energy characteristic forming another implant zone within either the remaining silicon carbide epitaxial layer or the deposited further silicon carbide epitaxial layer, so that the ions are implanted with an average depth within the remaining silicon carbide epitaxial layer or the deposited further silicon carbide epitaxial layer corresponding to another or the same designated thickness of an epitaxial layer of a further silicon carbide substrate being manufactured;
bonding another acceptor wafer onto the deposited further silicon carbide epitaxial layer, so that the deposited further silicon carbide epitaxial layer is arranged between the dispenser wafer and the further acceptor wafer; and
splitting the remaining silicon carbide epitaxial layer or the deposited further silicon carbide epitaxial layer along the implant zone, so that a further silicon carbide substrate represented by the further acceptor wafer with an epitaxial layer having the other or the same designated thickness is obtained.

6. The method according to claim 1, wherein the silicon carbide epitaxial layer is deposited so that the silicon carbide epitaxial layer comprises a dopant density between $1*10^{16}$ cm$^{-3}$ and $4*10^{15}$ cm$^{-3}$.

7. The method according to claim 1, wherein the silicon carbide epitaxial layer is deposited so that the silicon carbide epitaxial layer comprises a dopant density of less than $1*10^{16}$ cm$^{-3}$.

8. The method according to claim 1, wherein the predefined energy characteristic is selected so that the designated thickness of the epitaxial layer of the silicon carbide substrate being manufactured is sufficient to accommodate a drift layer of an electrical silicon carbide device.

9. The method according to claim 1, further comprising:
attaching the silicon carbide substrate with the manufactured electrical silicon carbide device to a carrier wafer facing the electrical silicon carbide device; and
removing the acceptor wafer from the epitaxial layer comprising the electrical silicon carbide device attached to the carrier wafer.

10. The method according to claim 9, further comprising producing a back side metal layer on a back side of the epitaxial layer comprising the electrical silicon carbide device.

11. The method according to claim 1, wherein ionized hydrogen atoms, ionized hydrogen molecules, an ionized noble gas or a combination of hydrogen ions and an ionized noble gas species are used for implanting ions with a predefined energy characteristic forming an implant zone within the epitaxial layer.

12. A method for manufacturing a silicon carbide device, the method comprising:
providing a silicon carbide dispenser wafer comprising a silicon face and a carbon face;
depositing a silicon carbide epitaxial layer on the silicon face of the dispenser wafer, the silicon carbide epitaxial layer comprising a silicon face facing away from the dispenser wafer;
implanting ions with a predefined energy characteristic to form an implant zone within the silicon carbide epitaxial layer, wherein the ions are implanted with an average depth within the silicon carbide epitaxial layer corresponding to a designated thickness of an epitaxial layer of the silicon carbide device being manufactured;
bonding an acceptor wafer onto the silicon face of the implanted silicon carbide epitaxial layer, so that the silicon carbide epitaxial layer is arranged between the dispenser wafer and the acceptor wafer; and
splitting the silicon carbide epitaxial layer along the implant zone, so that a silicon carbide substrate represented by the acceptor wafer with the epitaxial layer having the designated thickness is obtained; and
performing further processing steps on a carbon face of the epitaxial layer of the silicon carbide substrate,
wherein the depositing of the silicon carbide epitaxial layer is the only epitaxial deposition step performed between providing the silicon carbide dispenser wafer and performing the further processing steps, and wherein the further processing steps comprise any one of: implanting active regions, producing an oxide, depositing gates, contacts, metal lines or vias.

* * * * *